United States Patent
Hackett (12)

(10) Patent No.: US 6,358,899 B1
(45) Date of Patent: Mar. 19, 2002

(54) CLEANING COMPOSITIONS AND USE THEREOF CONTAINING AMMONIUM HYDROXIDE AND FLUOROSURFACTANT

(75) Inventor: Thomas Burkley Hackett, Columbus, OH (US)

(73) Assignee: Ashland, Inc., Ashland, KY (US)

( * ) Notice: Subject to any disclaimer, the term of this patent is extended or adjusted under 35 U.S.C. 154(b) by 0 days.

(21) Appl. No.: 09/534,303

(22) Filed: Mar. 23, 2000

(51) Int. Cl.[7] .............................. C11D 1/12; C11D 3/24; C11D 7/06
(52) U.S. Cl. .................. 510/175; 510/176; 510/181; 510/204; 510/254; 510/256; 510/412; 510/207; 510/499; 134/1.2; 134/1.3
(58) Field of Search .................................. 510/175, 176, 510/181, 204, 254, 256, 412, 207, 499; 134/1.2, 1.3

(56) References Cited

U.S. PATENT DOCUMENTS 4,213,873 A * 7/1980 Church .................. 252/174.21
4,275,100 A * 6/1981 Datta ......................... 369/286
5,840,772 A * 11/1998 Peters et al. .................. 521/41

* cited by examiner

*Primary Examiner*—Charles Boyer
(74) *Attorney, Agent, or Firm*—Connolly Bove Lodge & Hutz

(57) ABSTRACT

An aqueous composition comprising ammonium hydroxide in an amount of about 1 to about 30% by weight calculated as $NH_3$ and a surface active agent represented by the formula $$XF_2C(CFY)_nSO_3A$$

wherein
  X=F, OH or $SO_3A$;
  Y=F, H, OH or may be omitted thereby creating a double bond;
  n=1–12;
  A=$NH_4^+$, $H^+$, $Na^+$, $K^+$, $Li^+$, $R^+$ or organic amine cation and R is 1–4 straight chain alkyl group;
  and wherein the fluoroalkyl group is a linear group; and wherein the surface active agent is present in an amount of about 5 ppm to about 2000 ppm is useful for cleaning photomasks and especially chromium photomasks.

9 Claims, 1 Drawing Sheet

CLEANING COMPOSITIONS AND USE THEREOF CONTAINING AMMONIUM HYDROXIDE AND FLUOROSURFACTANT

DESCRIPTION

Technical Field

The present invention relates to aqueous compositions that are especially suitable for cleaning surfaces and particularly for cleaning glass substrates and photomasks. The present invention is particularly useful for cleaning chromium photomasks and glass substrates including those for use in fabricating flat panel and liquid crystal displays.

BACKGROUND OF INVENTION

In the fabrication of integrated circuits, one of the more critical procedures is the photolithographic processing. One of the most important aspects of photolithography processes used in the semiconductor industry is providing for defect-free photomasks.

Photomasks are used to project images onto wafer surfaces that ultimately define the regions for diffusions and implants of the doped regions, placements of interconnect lines, gates and metallizations, and locations of underlying bonding pads. The cleanliness of the photomask is extremely important. Particles left on the photomask prevent light exposure to the photoresist or cause light diffraction which may lead to defects in the final pattern.

Proper cleaning of the mask to remove unwanted particles is an integral part of mask making. One cleaning step currently used in photomask making comprises rinsing the mask with ammonium hydroxide. However, it has been observed that the ammonium hydroxide solution could stand improvement in its ability to wet the photomask and therefore ability to clean the photomask. This need is especially pronounced when dealing with chromium plated photomasks. Chromium plated photomasks are among the more important commercially employed photomasks.

Another concern with chromium photomasks is the need to avoid oxidants such as $H_2O_2$ in any cleaning solution for such since oxidants tend to cause etching of chromium and other metallic surfaces. The chromium photomasks comprise chromium coated on a glass substrate. Therefore, any cleaning solution used should not adversely effect the glass substrate and desirably also clean it.

Accordingly, room exists for improving the cleaning of photomasks.

Moreover, glass substrates used for fabricating flat panel displays such as liquid crystal displays must be properly cleaned and free from unwanted particles.

Therefore, a need also exists for improved cleaning of glass substrates.

SUMMARY OF INVENTION

The present invention relates to a composition which exhibits enhanced ability to clean various substrates including glass surfaces and photomasks.

More particularly, the present invention relates to an aqueous composition which comprises ammonium hydroxide in an amount of about 1 to about 30% by weight calculated as $NH_3$ and a surface active agent represented by the formula

wherein

X=F, OH or $SO_3A$;
Y=F, H, OH or may be omitted thereby creating a double bond;
n=1–12;
A=$NH_4^+$, $H^+$, $Na^+$, $K^+$, $Li^+$, $R^+$ or organic amine cation and R is 1–4 straight chain alkyl group;
and wherein the fluoroalkyl group is a linear group; and wherein the surface active agent is present in an amount of about 5 ppm to about 2000 ppm.

Another aspect of the present invention relates to a method for cleaning a substrate. The method comprises contacting the substrate with an aqueous composition comprising ammonium hydroxide in an amount of about 1 to about 30% by weight calculated as $NH_3$ and a surface active agent represented by the formula

wherein
X=F, OH or $SO_3A$;
Y=F, H, OH or may be omitted thereby creating a double bond;
n=1–12;
A=$NH_4^+$, $H^+$, $Na^+$, $K^+$, $Li^+$, $R^+$ or organic amine cation and R is 1–4 straight chain alkyl group;
and wherein the fluoroalkyl group is a linear group; and wherein the surface active agent is present in an amount of about 5 ppm to about 2000 ppm.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWINGS

The FIGURE is a graph comprising surface tension v. concentration for different surfactants.

BEST AND VARIOUS MODES FOR CARRYING OUT INVENTION

Figure 1:
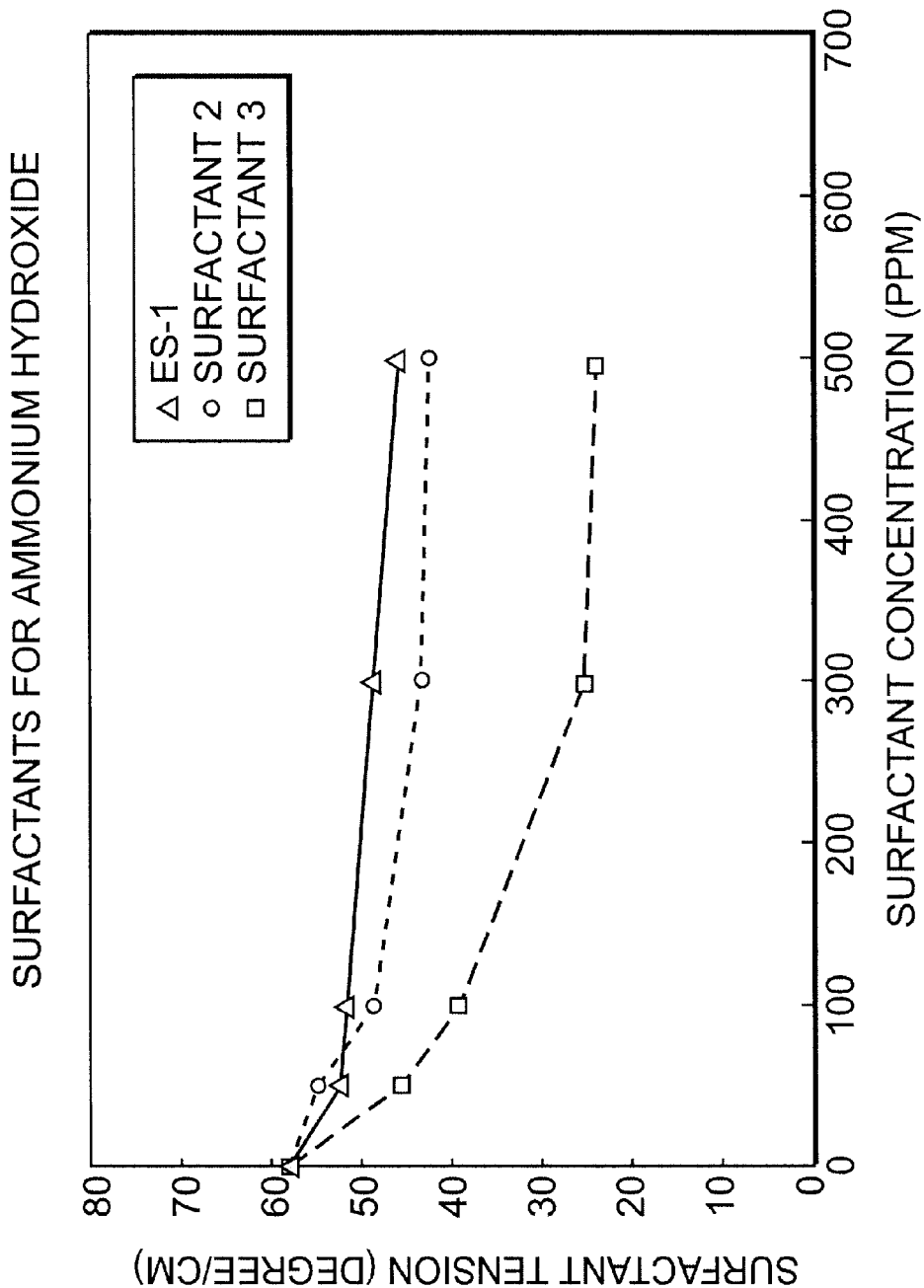

The aqueous compositions of the present invention comprise water and ammonium hydroxide. The ammonium hydroxide is typically present in amounts of about 1 to about 30% by weight, and more typically about 28 to about 30% by weight calculated as $NH_3$.

The aqueous compositions of the present invention also contain a fluorinated alkylsulfonate surfactant represented by the formula

wherein the fluoroalkyl group is a linear fluoroalkyl group;
X=F, OH or $SO_3A$;
Y=F, H, OH or may be omitted thereby creating a double bond;
n=1–12;
A=$NH_4^+$, $H^+$, $Na^+$, $K^+$, $Li^+$, $R^+$ or organic amine cation and R is 1–4 straight chain alkyl group.

It is essential for the success of the present invention that the fluoroalkyl group be linear or straight-chained. The preferred compounds contain 6 to 9 carbon atoms. In addition, in preferred compounds of the present invention X is F, Y is F and A is $NH_4^+$.

A specific surfactant employed in the present invention is the anionic fluoroalkyl surfactant available from 3M under the trade designation FC-93.

The amount of surface active agent employed is typically about 5 ppm to about 2000 ppm, and more typically about 50 to about 500 ppm, and preferably about 100 ppm to about 150 ppm.

The aqueous compositions of the present invention are typically free of other constituents and especially free from oxidants such as hydrogen peroxide.

The compositions of the present invention are especially useful for cleaning chromium plated photomasks and glass substrates such as those for use in flat panel displays. The photomasks include glass plated with chromium.

The following non-limiting example is presented to further illustrate the present invention.

EXAMPLE

Ammonium hydroxide solutions (29% $NH_3$) were poured in small beakers. Various amounts of surfactants shown in the FIGURE were added to the ammonia solution and stirred in to insure the surfactant was thoroughly mixed and soluble. Chromium plated glass photomasks were scrubbed with soft cleaning pads with the compositions being poured onto the pads. The surface tensions were measured with a DuNouy ring instrument. The data in the FIGURE indicates that surfactant 3, a straight chained perfluorinated sulfonic acid, ammonium salt within the scope of the present invention is the superior surfactant as compared to the octyl amine (surfactant 1) and the cyclic fluorinated sulfonic acid surfactant (surfactant 2).

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for cleaning a glass substrate or photomask which comprises contacting the substrate with an aqueous composition excluding an oxidizing agent and consisting essentially of ammonium hydroxide in an amount of about 1 to about 30% by weight calculated as $NH_3$ and a surface active agent represented by the formula

wherein

X=F, OH, or $SO_3A$;

Y=F, H, or OH, or may be omitted thereby creating a double bond;

n 1–12;

A=$NH_4^+$, $H^+$, $Na^+$, $K^+$, $Li^+$, $R^+$ or organic amine cation and R is 1–4 straight chain alkyl group;

and wherein the fluoroalkyl group is a linear group; and wherein the surface active agent is present in an amount of about 100 ppm to about 2000 ppm.

2. The method of claim 1 wherein the substrate is a chromium plated photomask.

3. The method of claim 1 wherein the amount of ammonium hydroxide is about 5 to about 15% by weight calculated as $NH_3$.

4. The method of claim 1 wherein the fluoroalkyl group has 6–9 carbon atoms.

5. The method of claim 4 wherein X is F, Y is F and A is $NH_4^+$.

6. The method of claim 1 wherein X is F, Y is F and A is $NH_4^+$.

7. The method of claim 1 wherein the amount of surface active agent is about 100 ppm to about 200 ppm.

8. The method of claim 1 wherein the substrate is a glass substrate.

9. The method of claim 1 wherein the substrate is a chromium plated glass photomask.

* * * * *